United States Patent
Seo

(10) Patent No.: US 11,296,200 B2
(45) Date of Patent: Apr. 5, 2022

(54) SEMICONDUCTOR DEVICE

(71) Applicant: SK hynix Inc., Icheon-si (KR)

(72) Inventor: Sung Kil Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/001,680

(22) Filed: Aug. 25, 2020

(65) Prior Publication Data

US 2021/0296460 A1 Sep. 23, 2021

(30) Foreign Application Priority Data

Mar. 17, 2020 (KR) .................. 10-2020-0032699

(51) Int. Cl.
*H01L 29/423* (2006.01)
*H01L 23/522* (2006.01)
*H01L 29/06* (2006.01)

(52) U.S. Cl.
CPC .... *H01L 29/42356* (2013.01); *H01L 23/5226* (2013.01); *H01L 29/0646* (2013.01)

(58) Field of Classification Search
CPC ........... H01L 29/42356; H01L 29/0646; H01L 23/5226

See application file for complete search history.

(56) References Cited

U.S. PATENT DOCUMENTS

| | | | |
|---|---|---|---|
| 9,171,835 B2 | 10/2015 | Jeong et al. | |
| 9,611,197 B1 | 4/2017 | Zhang et al. | |
| 2004/0238900 A1* | 12/2004 | Yamada | H01L 27/0207 257/401 |
| 2007/0267680 A1* | 11/2007 | Uchino | H01L 27/0207 257/315 |
| 2008/0079481 A1* | 4/2008 | Tomita | G05F 3/262 327/543 |
| 2008/0246061 A1* | 10/2008 | Yang | H01L 21/823807 257/288 |
| 2018/0158830 A1* | 6/2018 | Kim | H01L 27/1104 |
| 2020/0273851 A1* | 8/2020 | Liaw | H03K 19/0013 |
| 2021/0035902 A1* | 2/2021 | Kang | H01L 27/0924 |

OTHER PUBLICATIONS

Lee et al.; Effects of Array Type of Dummy Active Diffused Region and Gate Geometries on Narrow NMOSFETs with SiC S/D Stressors; 2014; 2014 IEEE International Nanoelectronics Conference (INEC); pp. 1-4 (Year: 2014).*

* cited by examiner

Primary Examiner — Syed I Gheyas

(57) ABSTRACT

A semiconductor device including one or more transistors is disclosed. The semiconductor device includes a first active region disposed over a well region of a substrate, a plurality of dummy active regions disposed around the first active region, and a gate disposed to traverse the first active region, wherein a portion of the gate is disposed to overlap with at least one of the plurality of dummy active regions and is electrically coupled to the at least one of the plurality of dummy active regions.

22 Claims, 12 Drawing Sheets

SEMICONDUCTOR DEVICE

CROSS-REFERENCE TO RELATED APPLICATION

This patent document claims priority and the benefits of Korean patent application No. 10-2020-0032699 filed on Mar. 17, 2020, which is hereby incorporated in its entirety by reference.

TECHNICAL FIELD

The technology and implementations disclosed herein generally relate to a semiconductor device, and more particularly to a semiconductor device including one or more transistors.

BACKGROUND

In recent times, with the increasing development of electronic products that are lighter, thinner, shorter, and smaller, demand for highly integrated semiconductor devices has been rapidly increasing. According to the trends in the downscaling of semiconductor devices, a device isolation structure can be formed in a smaller and narrower region, such that a change in electrical characteristics may occur more readily in smaller semiconductor devices.

Therefore, there is a need to develop a device isolation structure in which variation or degradation of electrical characteristics can be prevented from occurring within a smaller and narrower region. In addition, there is a growing need to reduce the size of a formation region of one or more transistors, which are used in constructing a unit cell of the semiconductor device.

SUMMARY

Various embodiments of the disclosed technology relate to a semiconductor device for improving stress of at least one transistor and for reducing the size of an overall region in which the transistor may be placed.

In accordance with an embodiment of the disclosed technology, a semiconductor device may include a first active region disposed over a well region of a substrate, a plurality of dummy active regions disposed around the first active region, and a gate disposed to traverse the first active region, wherein a portion of the gate is disposed to overlap with at least one of the plurality of dummy active regions and is electrically coupled to the at least one of the plurality of dummy active regions.

In accordance with another embodiment of the disclosed technology, a semiconductor device may include a first active region formed over a well region of a substrate, a plurality of dummy active regions formed over the well region, and spaced apart from the first active region by a predetermined distance, a gate disposed over one dummy active region among the plurality of dummy active regions, and a gate-through-silicon via coupled to the one dummy active region and passing through the gate, and configured to couple the one dummy active region to a first metal layer disposed over the gate.

In accordance with still another embodiment of the disclosed technology, a semiconductor device may include a first transistor region, and a second transistor region arranged to be symmetrical to the first transistor region with respect to a first direction, wherein each of the first transistor region and the second transistor region includes; a first active region disposed over a well region of a substrate, a dummy active region disposed over the well region, and spaced apart from the first active region by a predetermined distance, a gate formed over the dummy active region, a gate-through-silicon via coupled to the dummy active region and passing through the gate; and a first metal layer that couples the dummy active region to the gate.

It is to be understood that both the foregoing general description, and the following detailed description, of the technology disclosed herein are illustrative and explanatory and intended to provide further explanation of the scope of the disclosure to those skilled in the art.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of a semiconductor device that substantially addresses one or more issues related to limitations or disadvantages of the related art. Some implementations of the disclosed technology suggest a semiconductor device that can improve stress of at least one transistor and can reduce the size of an overall region for the transistor.

Reference will now be made in detail to aspects of the disclosed technology, embodiments and examples of which are illustrated in the accompanying drawings. Wherever possible, the same reference numbers are used throughout the drawings to refer to the same or like portions.

In association with the embodiments of the disclosed technology, specific structural and functional descriptions are disclosed only for illustrative purposes. The embodiments represent a limited number of possible embodiments; however, embodiments of the disclosed technology can be implemented in various or different ways without departing from the scope or spirit of the disclosed technology.

In describing the disclosed technology, the terms "first" and "second" may be used to describe multiple components, but the components are not limited by the terms in number or order. The terms may be used to distinguish one component from another component. For example, a first component may be called a second component and a second component may be called a first component without departing from the scope of the disclosure.

The terms used in the present application are merely used to describe specific embodiments and are not intended to limit the disclosed technology. A singular expression may include a plural expression unless explicitly stated otherwise.

Unless otherwise defined, all terms used herein, including technical or scientific terms, have the same meanings as understood by those skilled in the art. Terms defined in a generally used dictionary may be analyzed to have the same meaning as the context of the relevant art and should not be analyzed to have an ideal meaning or an excessively formal meaning unless clearly defined in the present application. The terminology used in the disclosed technology is for the purpose of describing particular embodiments only and is not intended to limit the disclosure.

Figure 1:
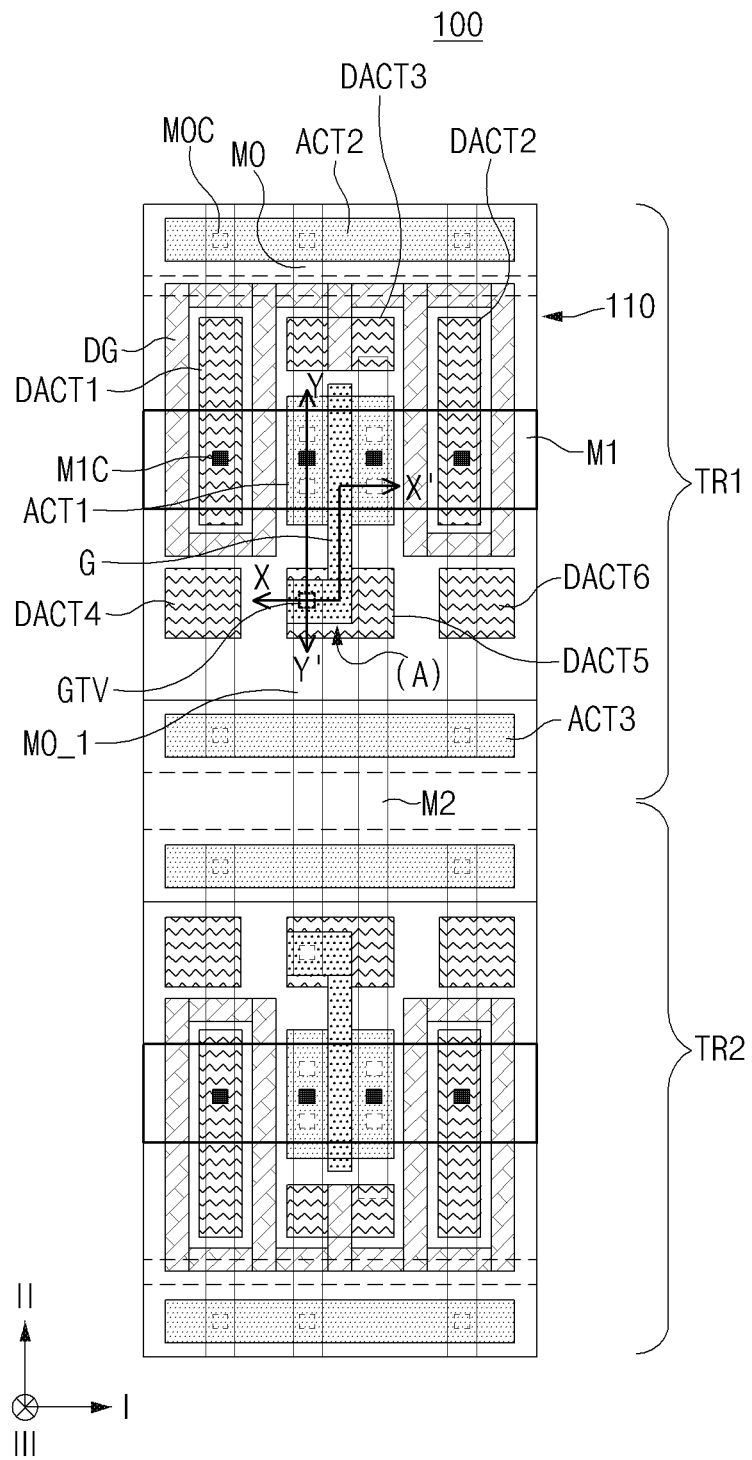
FIG. 1 is a diagram illustrating a layout structure of a semiconductor device in accordance with an embodiment of the disclosure.

FIG. 1 is a diagram illustrating a layout structure of a semiconductor device in accordance with an embodiment of the disclosure.

Referring to FIG. 1, a plurality of transistor regions TR1 and TR2 may be substantially identical in structure to each other, such that the following embodiment will hereinafter be described using only one transistor region TR1 as an example.

The transistor region TR1 may be implemented as an NMOS transistor or a PMOS transistor without being limited thereto. In addition, the transistor region TR2 may be implemented as an NMOS transistor or a PMOS transistor without being limited thereto.

The first direction (I) may refer to a direction perpendicular to a second direction (II). A third direction (III) may refer to a direction perpendicular to a horizontal plane extending in the first direction (I) and the second direction (II). For example, the third direction (III) may be perpendicular to each of the first direction (I) and the second direction (II).

A substrate 100 may include, for example, a semiconductor material such as silicon (Si) or germanium (Ge), or a compound semiconductor material such as silicon germanium (SiGe), silicon carbide (SiC), gallium arsenide (GaAs), indium arsenide (InAs), or indium phosphide (InP). The substrate 100 may include a conductive region, for example, a well doped with impurities or a structure doped with impurities.

A well region 110 may be formed in a designated region of the substrate 100. In this case, the substrate 100 may be doped with impurities to have P-type or N-type conductive materials.

For convenience of description, it is assumed that the substrate 100 is implemented as a P-type substrate. In some embodiments, a well region 110 may be doped with impurities to have P-type or N-type conductive materials. For convenience of description, it is assumed that the well region 110 is implemented as an N-type well.

The well region 110 may include a plurality of active regions ACT1~ACT3. The plurality of active regions ACT1~ACT3 may be regions for receiving source, drain, and body voltages of a transistor region.

The plurality of active regions ACT1~ACT3 may be doped with impurities to have P-type or N-type conductivity. In some implementations, each of the plurality of active regions ACT1~ACT3 may be implemented as a P-type region doped with P-type impurities. The plurality of active regions ACT1~ACT3 may be configured to have different sizes and different shapes according to use with various circuit types.

The active region ACT1 may be located at a center region of the transistor TR1. The active region ACT1 may be formed in a rectangular, island shape.

The active regions ACT2 and ACT3 may be formed at both sides of the second direction (II) with respect to the center region of the transistor TR1. That is, the active region ACT2 may be located at one side of the active region ACT1 in the second direction (II). The active region ACT3 may be located at the other side of the active region ACT1 in the second direction (II). Each of the active regions ACT2 and ACT3 may be formed in a line shape extending in the first direction (I). The active region ACT2 and the active region ACT3 may be spaced apart from each other by a predetermined distance in the second direction (II). The active regions ACT2 and ACT3 may have the same or substantially the same length in the first direction (I).

In addition, a plurality of dummy active regions DACT1~DACT6 may be formed over the substrate 100. The plurality of dummy active regions DACT1~DACT6 may each be formed in the vicinity of an outer wall of the active region ACT1 formed in the center region. For example, when viewed along the third direction, the plurality of dummy active regions DACT1~DACT6 may be arranged on the substrate 100 around active region ACT1 in the first and second directions.

In some embodiments, the plurality of dummy active regions DACT1~DACT6 may be disposed to prevent stress from being applied to transistors in the active region ACT1. For example, dummy active regions DACT1~DACT6 may be formed in the vicinity of and adjacent to the active region ACT1.

In the semiconductor device, it is necessary for unit elements (e.g., a transistor, a diode, a resistor, etc.) formed over the semiconductor substrate to be electrically isolated from one another. Therefore, such a device isolation process may be accomplished with an initial-stage process for use in all semiconductor fabrication processes. The initial-stage process can greatly affect the size of each active region and a fabrication margin of a subsequent process.

For example, a shallow trench isolation (STI) process may solve instability resulting from fabrication processes, such as degradation of a field oxide film caused by a design rule of semiconductor devices. In recent times, in order to further increase the degree of integration of highly-integrated semiconductor memory devices, the semiconductor memory devices have been developed to have smaller-sized constituent element. Semiconductor memory devices with smaller elements may have a trench with weakened sidewalls due to stress in the shallow trench isolation (STI) process. To address this possibility, semiconductor devices in embodiments of the disclosed technology may include a plurality of dummy active regions DACT1~DACT6 in the semiconductor devices to reduce or to prevent stress from occurring in one or more transistors affected by the shallow trench isolation (STI) process.

Each of the plurality of dummy active regions DACT1~DACT6 may be formed as a P-type region doped with P-type impurities. Although in an embodiment disclosed herein, each of the plurality of dummy active regions DACT1~DACT6 is formed as a P-type region for convenience of description, the scope or spirit of the disclosed technology is not limited thereto. In other embodiments, the plurality of dummy active regions DACT1~DACT6 can also be formed with other types of materials as needed.

Referring to FIG. 1, the dummy active regions DACT1 and DACT2, from among the plurality of dummy active regions DACT1~DACT6, may be disposed at both sides of the active region ACT1 with respect to the center region. Each of the dummy active regions DACT1 and DACT2 may be formed in a line shape extending in the second direction (II). Each of the dummy active regions DACT1 and DACT2 may be formed to have a longer length, as compared to the active region ACT1, in the second direction (II). For example, dummy active region DACT1 may be disposed in the first direction from the active region ACT1 such that an edge or side of the dummy active region DACT1 covers, or entirely overlaps, the adjacent edge or side of the active region ACT1. Similarly, on the side of the active region ACT1 opposite to the dummy active region DACT1, the dummy active region DACT2 may be disposed in the first direction from the active region ACT1 such that an edge or side of the dummy active region DACT2 covers, or entirely overlaps, the adjacent edge or side of the active region ACT1. The dummy active region DACT1 and the dummy active region DACT2 may be spaced apart from each other by a predetermined distance in the first direction (I). The active region ACT1 may be disposed between the dummy active region DACT1 and the dummy active region DACT2.

The active region ACT1 and the active region ACT2 may be spaced apart from each other by a predetermined distance in the second direction (II). The dummy active region DACT3 may be formed between the active region ACT1 and the active region ACT2. In other words, the dummy active region DACT3 may be located contiguous or adjacent to the active region ACT2. The dummy active region DACT3 may be disposed between the dummy active regions DACT1 and DACT2 in the first direction (I). The dummy active region DACT3 may be formed in a rectangular or line shape. The dummy active region DACT3 may have the same or substantially the same width as the active region ACT1 in the first direction (I).

The active region ACT1 and the active region ACT3 may be spaced apart from each other by a predetermined distance in the second direction (II), with active region ACT3 on the other side of active region ACT1 opposite to active region ACT2. The plurality of dummy active regions DACT4~DACT6 may be formed between the active region ACT1 and the active region ACT3. Each of the plurality of dummy active regions DACT4~DACT6 may be formed in a rectangular or line shape.

The plurality of dummy active regions DACT4~DACT6 may be disposed in the second direction (II) from the sides (e.g., at the lower sides) of the plurality of dummy active regions DACT1~DACT3, respectively. Each of the plurality of dummy active regions DACT4~DACT6 may be located contiguous or adjacent to the active region ACT3. The dummy active regions DACT4~DACT6 may be spaced apart from one another in the first direction (I), and may be spaced apart by a predetermined distance.

A gate (G) may be disposed over the active region ACT1 and the dummy active region DACT5. The transistors TR1 and TR2 may be distinguished from each other by each having its own respective gates.

Gate (G) may be formed to extend in the second direction (II), and may be formed in an angle or a hammer shape. For example, the handle of the hammer shape may extend in the second direction (II) while region (A) of the gate (G) corresponds to the head of the hammer shape and protrudes or extends in the first direction (I). In other words, the gate (G) may extend in the second direction (II), and may be formed in an L-shaped structure in which the region (A) of the gate (G) is bent in the first direction (I). The region (A) of the gate (G) may be disposed to overlap with the dummy active region DACS. In this case, the region (A) of the gate (G) may be formed to provide a voltage to each transistor.

The region (A) of the gate (G) may be electrically coupled to the dummy active region DACT5 through a gate-through-silicon via (GTV). That is, the region (A) of the gate (G) and the dummy active region DACT5 may be disposed over the same line in the third direction (III).

The region (A) of the gate (G) and the dummy active region DACT5 may have the same size, or may have different sizes, with respect to each of the first direction (I) and the second direction (II). In some embodiments, the region (A) of the gate (G) may be smaller in size than the dummy active region DACT5 with respect to each of the first direction (I) and the second direction (II).

Whereas the gate (G) is disposed to traverse the active region ACT1 at or near a top surface of the active region ACT1, the gate (G) may not be disposed in peripheral regions of the transistor TR1, such as regions in which the dummy active regions DACT4 and DACT6 are disposed. Therefore, in the absence of a gate pattern in any specific region, there is a difference in pattern density such that can result in gate patterns that are unevenly implemented in the exposure and etching step.

Thus, a dummy gate DG may be formed such that any difference in separation distance between gate patterns can be reduced by providing the dummy gate DG. Gate patterns can be spaced apart from each other at more even intervals of the same or substantially the same distance by implementing the dummy gate DG. In FIG. 1, as viewed in the third direction, the dummy gate DG may be disposed adjacent to some of the edges of the dummy active regions DACT1~DACT6. The dummy gate DG may be formed to surround the dummy active regions DACT1 and DACT2. The dummy gate DG may be formed to traverse the center region of the dummy active region DACT3 in the second direction (II).

Sides or edges of the gate (G) may be spaced apart from the dummy gate DG by a predetermined distance in the first direction (I). Segments of the dummy gate DG may have substantially the same or the same width (e.g., the width of the first direction I) as the gate (G) outside of region (A).

A plurality of metal contacts (M0C) may be formed over the active regions ACT1~ACT3. A plurality of metal contacts (M0C) may be spaced apart from each other by a predetermined distance in the first direction (I) at or near top surfaces of the active regions ACT2 and ACT3. A plurality of metal contacts (M0C) may be formed in a lattice or grid shape in the first direction (I) and the second direction (II) at or near a top surface of the active region (ACT1).

As described above, a gate-through-silicon via (GTV) may be formed over the dummy active region DACT5. The gate-through-silicon via (GTV) may be electrically coupled to region (A) of the gate (G). In addition, the gate-through-silicon via (GTV) may be electrically coupled to a lower dummy active region DACT5 after passing through the gate (G).

In addition, a plurality of metal layers (M0) may be formed over the substrate 100. Each of the metal layers (M0) may be formed in a line shape extending in the second direction (II). The plurality of metal layers (M0) may be formed to have different lengths in the second direction (II), and may be staggered relative to each other. The plurality of metal layers (M0) may be spaced apart from each other by a predetermined distance in the first direction (I). The plurality of metal layers (M0) may be electrically coupled to the active regions ACT1~ACT3 through the metal contacts (M0C).

The metal layer (M0_1) may be disposed on an extension line of the metal layers (M0). The metal layer (M0_1) may be formed in a line shape extending in the second direction (II). The metal layer (M0_1) may be electrically coupled to the gate (G) and the dummy active region DACT5 through the gate-through-silicon via (GTV). The metal layer (M0_1) may electrically couple the gate-through-silicon via (GTV) of the transistor region TR1 to the gate-through-silicon via (GTV) of the transistor region TR2. That is, the gate (G) hammer region (A) of the transistor region TR1 may be electrically coupled to the gate (G) hammer region (A) of the transistor region TR2 through the metal layer (M0_1).

The metal layer M2, from among the plurality of metal layers (M0), may be spaced apart from the metal layer (M0_1) by a predetermined distance in the first direction (I). The metal layer M2 may be formed in a line shape extending in the second direction (II). The metal layer (M2) may electrically couple the active region ACT1 of the transistor region TR1 to the active region ACT1 of the transistor region TR2.

A plurality of metal contacts (M1C) may be formed over the metal layers (M0). The plurality of metal contacts (M1C) may be spaced apart from each other by a predetermined distance in the first direction (I).

In addition, a plurality of metal layers (M1) may be formed over the metal layers (M0). Each of the metal layers (M1) may be formed in a line shape extending in the first direction (I). The metal layers (M1) may be electrically coupled to the active region ACT1 through the metal contacts (M1C).

Figure 2:
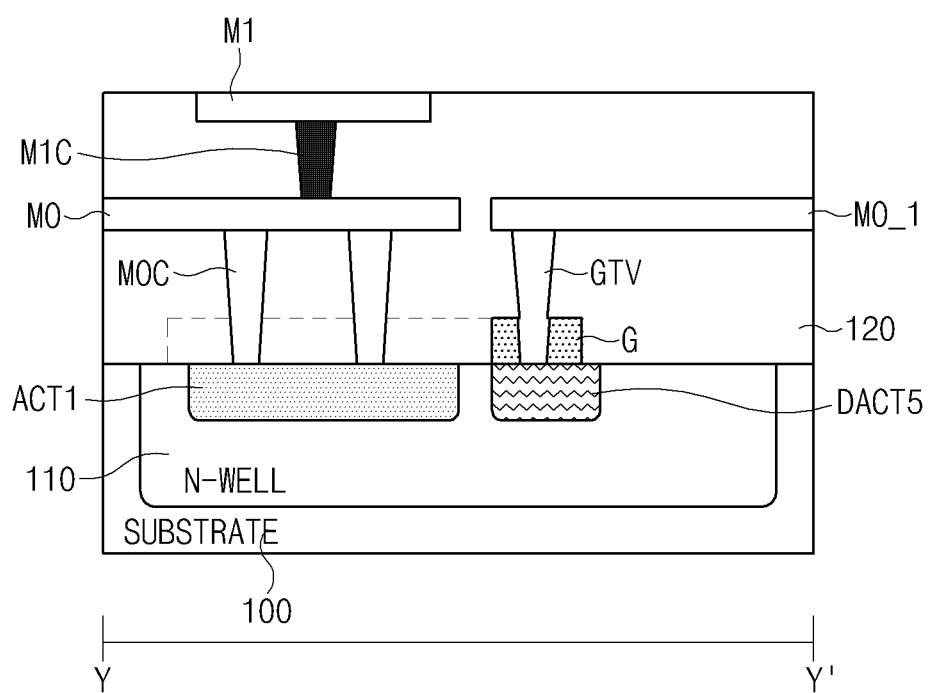
FIG. 2 is a cross-sectional view illustrating an example of a semiconductor device taken along the line Y-Y' shown in FIG. 1 in accordance with an embodiment of the disclosure.

FIG. 2 is a cross-sectional view illustrating an example of a semiconductor device shown in FIG. 1 in accordance with an embodiment of the disclosure, taken along the line Y-Y' shown in FIG. 1.

Referring to FIG. 2, a well region 110 may be formed in or over the substrate 100. In this case, the substrate 100 may be implemented as a P-type substrate doped with P-type impurities.

The well region 110 may include the active region ACT1 of the transistor and the dummy active region DACT5. In this case, each of the active region ACT1 and the dummy active region DACT5 may be formed as a P-type region doped with P-type impurities.

Region (A) of the gate (G) of the transistor may be formed over the dummy active region DACT5 in the third direction (III). The gate (G) may be formed in or over an interlayer insulation film 120. The interlayer insulation film 120 may be formed as an insulation layer such as an oxide film. The gate (G) may be electrically coupled to the lower dummy active region DACT5 through the gate-through-silicon via (GTV).

In some embodiments, the dummy active region DACT5 may be formed below the gate (G), i.e., the dummy active region DACT5 may be offset from the gate (G) in the second direction (II). In this example, if the dummy active region DACT5 is not formed below the gate (G) in the third direction (III), and the dummy active region DACT5 is isolated away from a side surface of the gate (G), then the width of the cross-section illustrated by line Y-Y' may increase in order to include the dummy active region DACT5. Therefore, in FIG. 2, the dummy active region DACT5 disposed below the gate (G) is formed along the same vertical line, and any distance separating the active region ACT1 and the dummy active region DACT5 is reduced or eliminated. A shorter width of the line Y-Y' may correspond to a device isolation structure disposed in a smaller or narrower region in a semiconductor device.

Each of the metal contacts (M0C) may be formed between a top surface of the active region ACT1 and a bottom surface of the metal layer (M0). The gate-through-silicon via (GTV) may be formed between a bottom surface of the metal layer (M0_1) and a top surface of the dummy active region DACT5 while simultaneously passing through the gate (G). The gate-through-silicon via (GTV) may enable the upper metal layer (M0_1), the lower gate (G), and the dummy active region DACT5 to be electrically coupled to one another.

In some embodiments, the gate (G) and the dummy active region DACT5 may be electrically coupled to each other through the gate-through-silicon via (GTV). As a result, a Plasma Induced Damage (PID) can be prevented from occurring in a subsequent plasma implantation process in which sidewalls of a device isolation trench need to be protected.

That is, the gate-through-silicon via (GTV) and the dummy active region DACT5 electrically coupled to the gate (G) may serve as a diode pattern capable of preventing plasma induced damage (PID). As a result, electrical characteristics of constituent elements of the semiconductor device can be prevented from deterioration. In more detail, shifting of a threshold voltage of the transistor may be considered to be one example of such deterioration in electrical characteristics.

In addition, the metal layer (M0) and the metal layer (M0_1) may be formed in the same layer with respect to the third direction (III), and may be spaced apart from each other by a predetermined distance in the second direction (II). The metal contact (M1C) may be formed between a top surface of the metal layer (M0) and a bottom surface of the metal layer (M1). The metal layer (M1) may be formed above the metal layer (M0). The metal layer (M1) may be electrically coupled to the metal layer (M0) through the metal contact (M1C).

FIGS. 3A to 3D are cross-sectional views illustrating examples of fabrication processes of a semiconductor device taken along the line Y-Y' shown in FIG. 1 in accordance with embodiments of the disclosure. FIGS. 4A to 4D are cross-sectional views illustrating examples of fabrication processes of a semiconductor device taken along the line X-X' shown in FIG. 1 in accordance with embodiments of the disclosure. In FIGS. 3A-3D and 4A-4D, some constituent elements that are the same as those of FIG. 2 will herein be omitted for convenience of description.

Figure 3A:
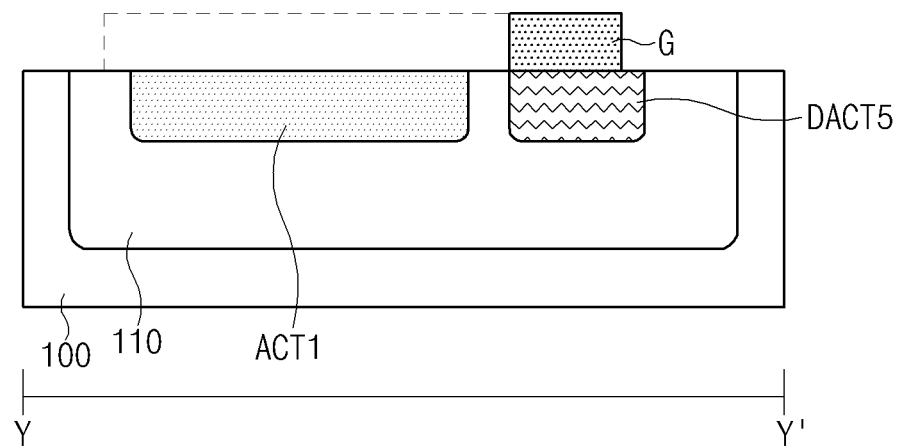
FIGS. 3A to 3D are cross-sectional views illustrating examples of fabrication processes of a semiconductor device taken along the line Y-Y' shown in FIG. 1 in accordance with embodiments of the disclosure.
Figure 4A:
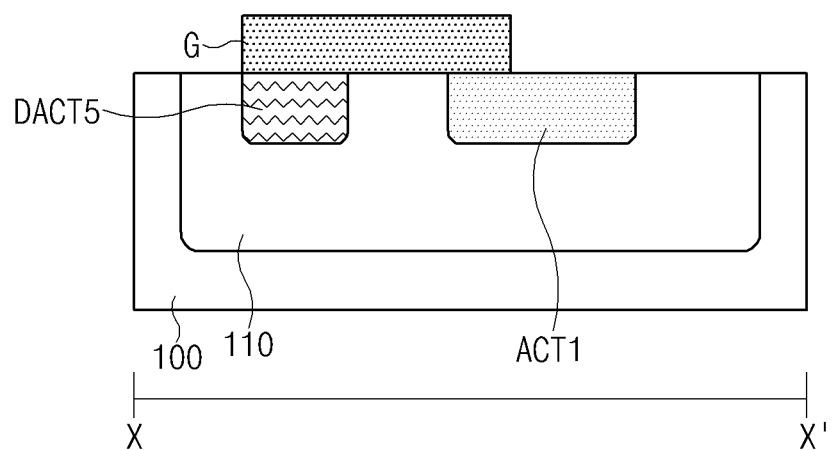
FIGS. 4A to 4D are cross-sectional views illustrating examples of fabrication processes of a semiconductor device taken along the line X-X' shown in FIG. 1 in accordance with an embodiment of the disclosure.

Referring to FIGS. 3A and 4A, an impurity implantation process may be performed to adjust doping density in the substrate 100, resulting in formation of the well region 110. In this case, the well region 110 may serve as a body of a device (e.g., a transistor).

The active region ACT1 of the transistor and the dummy active region DACT5 may be formed in the well region 110. In this case, the active region ACT1 and the dummy active region DACT5 may be formed through shallow trench isolation (STI), Local Oxidation of Silicon (LOCOS) processing, or the like.

In addition, the gate (G) of the transistor may be formed over the dummy active region DACT5. That is, the gate (G) may be formed over the dummy active region DACT5 in a vertical direction or third direction (III). After an oxide film (not shown) and a conductive line are formed over the dummy active region DACT5, the conductive line may be etched in response to a gate length of the corresponding transistor, resulting in formation of patterns of the gate (G).

The gate (G) may correspond to a hammer region (A) that is to be coupled to upper and lower metal lines (not illustrated).

In this case, the gate (G) may be formed of all kinds of conductive materials. For example, the gate (G) may be formed of any one selected from among metal, metal and polysilicon, and polysilicon. In some implementations, the gate (G) may be formed of metal and polysilicon.

Figure 3B:
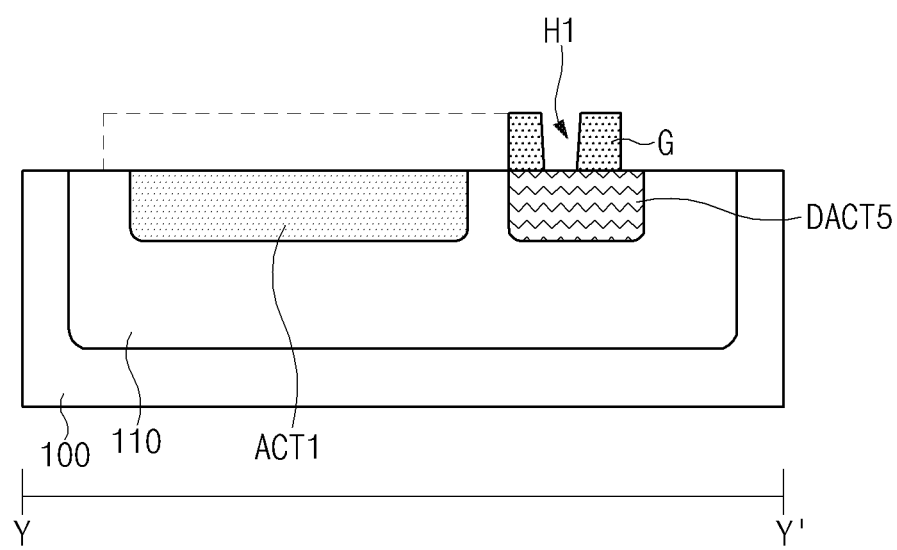
Figure 4B:
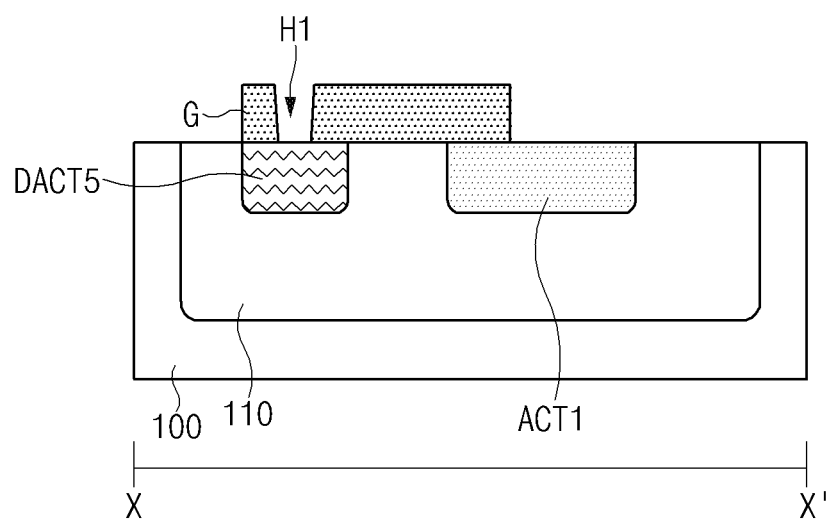

Thereafter, as shown in FIGS. 3B and 4B, the gate (G) formed over the dummy active region DACT5 in a vertical direction may be etched, resulting in formation of a contact hole H1. In this case, the contact hole H1 may be etched to expose a top surface of the dummy active region DACT5.

Figure 3C:
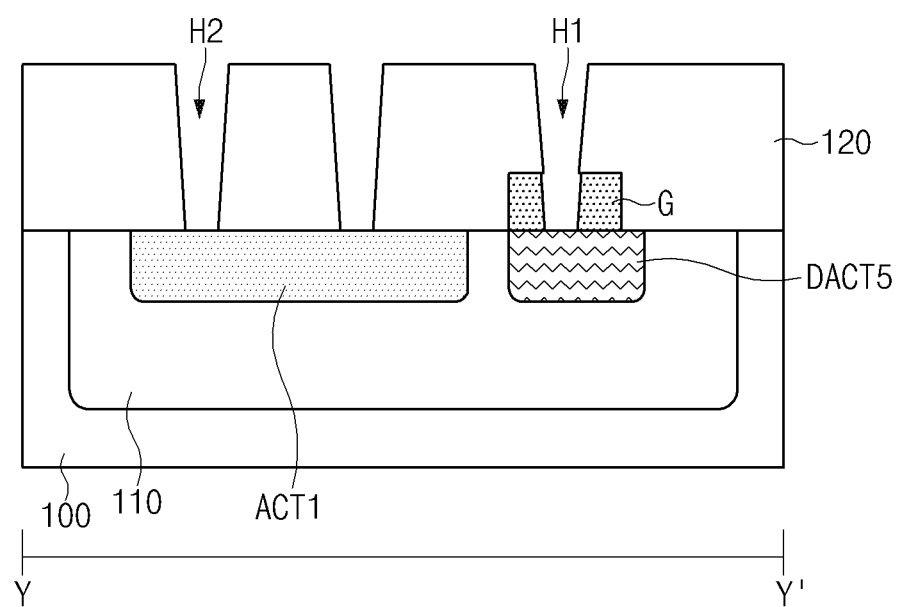
Figure 4C:
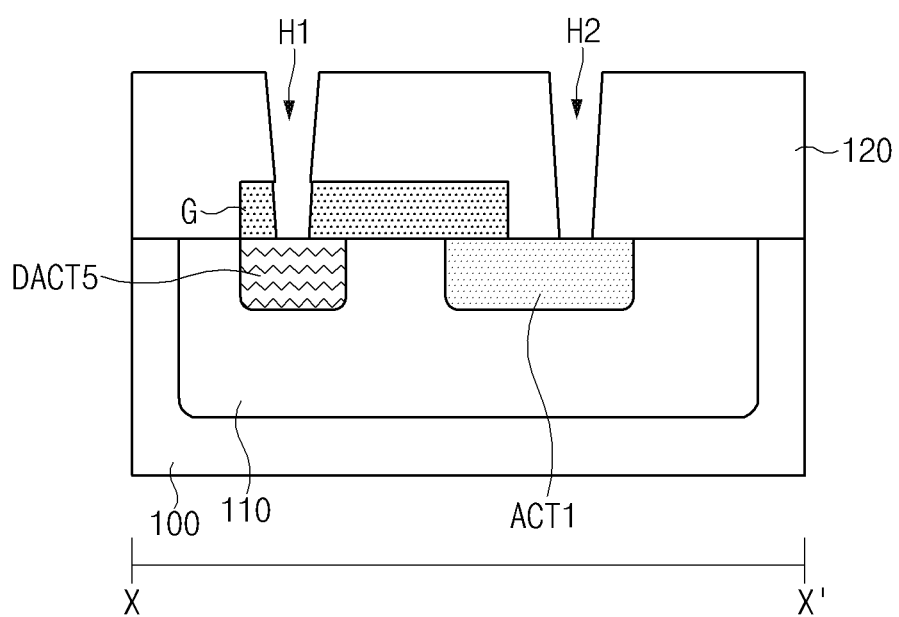

Subsequently, as shown in FIGS. 3C and 4C, an interlayer insulation film 120 may be deposited over the entire surface of the gate (G) structure. In this case, the interlayer insulation film 120 may include a nitride film or an oxide film.

The interlayer insulation film 120 may be etched to form a contact hole H2. In this case, the contact hole H2 may be etched to expose a top surface of the active region ACT1. Therefore, the lower active region ACT1 and the contact for connecting the dummy active region DACT5 and the upper metal line may be electrically isolated from each other. When the interlayer insulation film 120 is etched, the hole H1 of the gate (G) may be opened or re-opened.

Figure 3D:
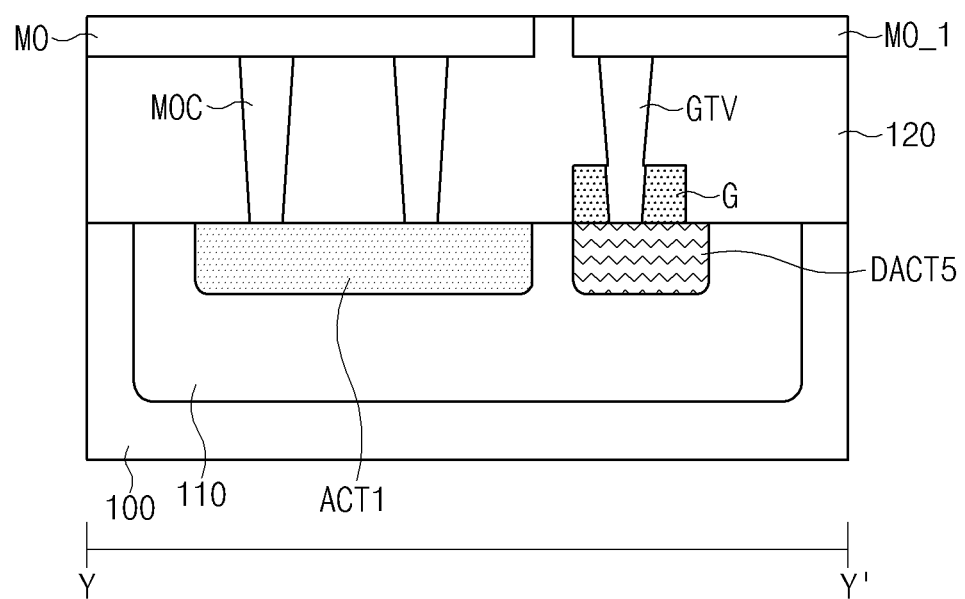
Figure 4D:
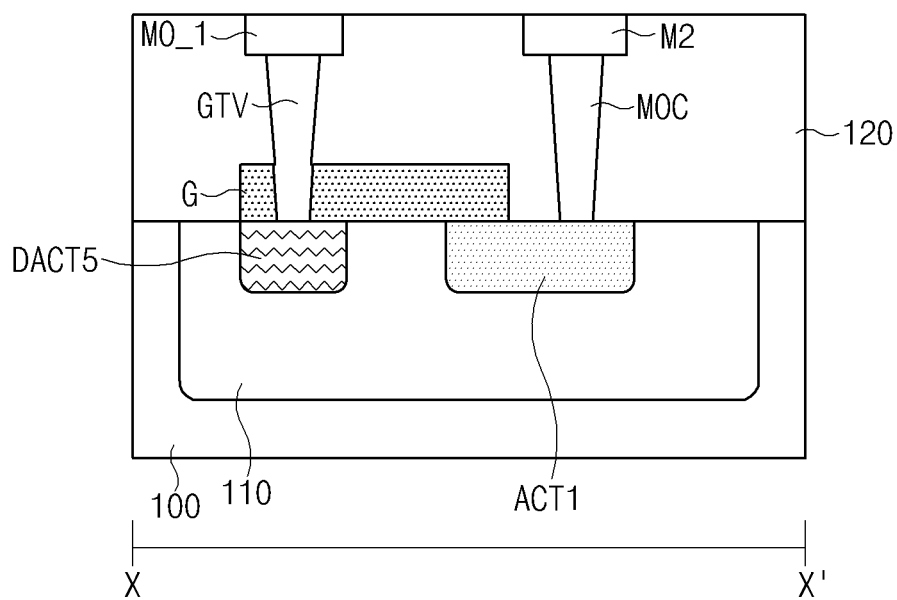

Thereafter, as shown in FIGS. 3D and 4D, the contact holes H1 and H2 may be buried with contact plug materials, such that the metal contact (M0C) and the gate-through-silicon via (GTV) can be formed. Therefore, the gate-through-silicon via (GTV), the gate (G), and the dummy active region DACT5 can be physically in contact with one another. In this case, materials buried in the contact hole H1 to form the gate-through-silicon via (GTV) may be identical to materials buried in the contact hole H2 to form the metal contact (M0C).

In some embodiments, in order to improve electrical characteristics, a boundary region in which the contact hole H1 is in contact with the gate (G) and the dummy active region DACT5 may be additionally buried with a specific material.

The specific material that is buried in the boundary region where the contact hole H1 is in contact with the gate (G) and the dummy active region DACT5 should be electrically coupled to the gate (G) and the dummy active region DACT5, such that the specific material may be formed of a conductive material. In this case, the conductive material may include metal materials such as tungsten (W), titanium (Ti), and titanium nitride (TiN), may include polysilicon, or may include metal and polysilicon.

Thereafter, the metal layer (M0) may be deposited over the metal contact (M0C), and the metal layer (M0_1) may be deposited over the gate-through-silicon via (GTV).

Figure 5:
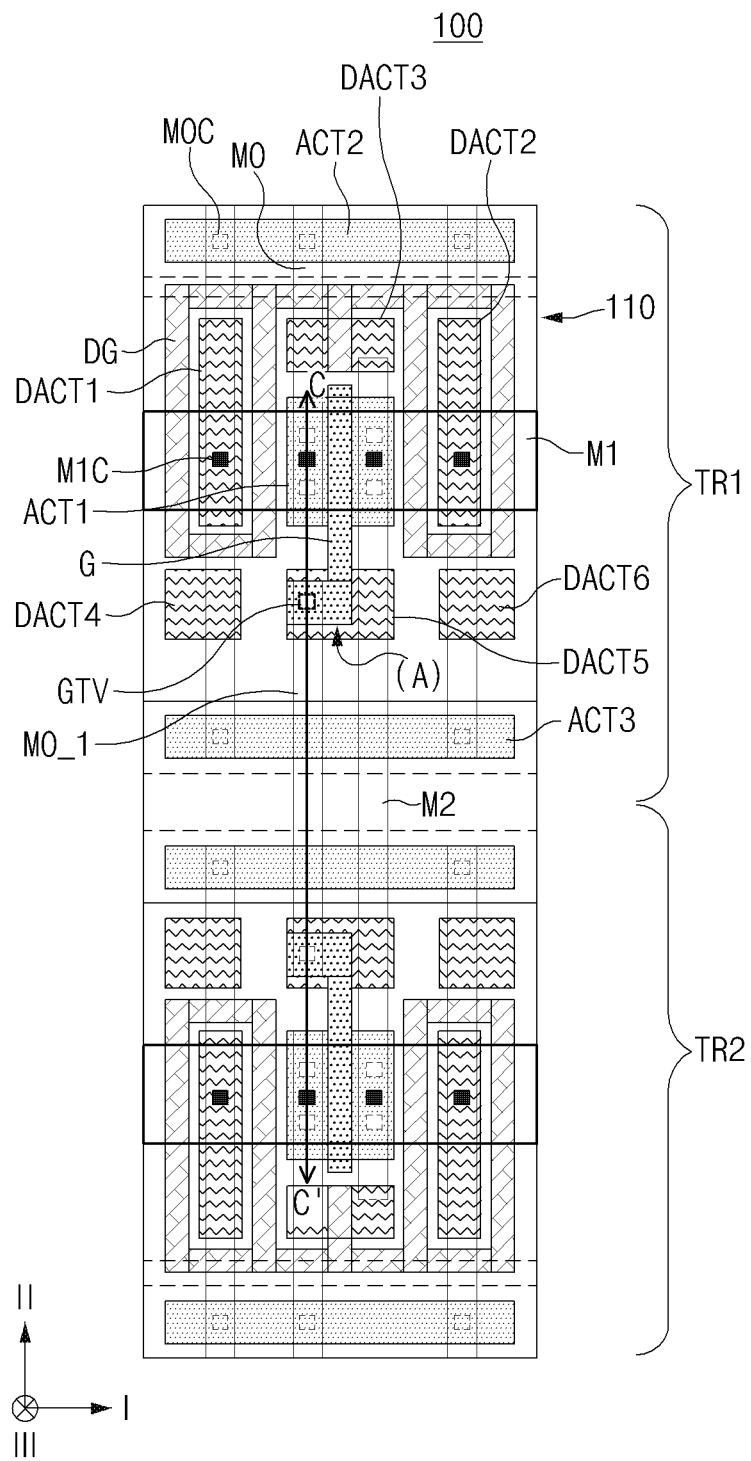
FIG. 5 is a diagram illustrating an example of a layout structure of a semiconductor device in accordance with an embodiment of the disclosure.
Figure 6:
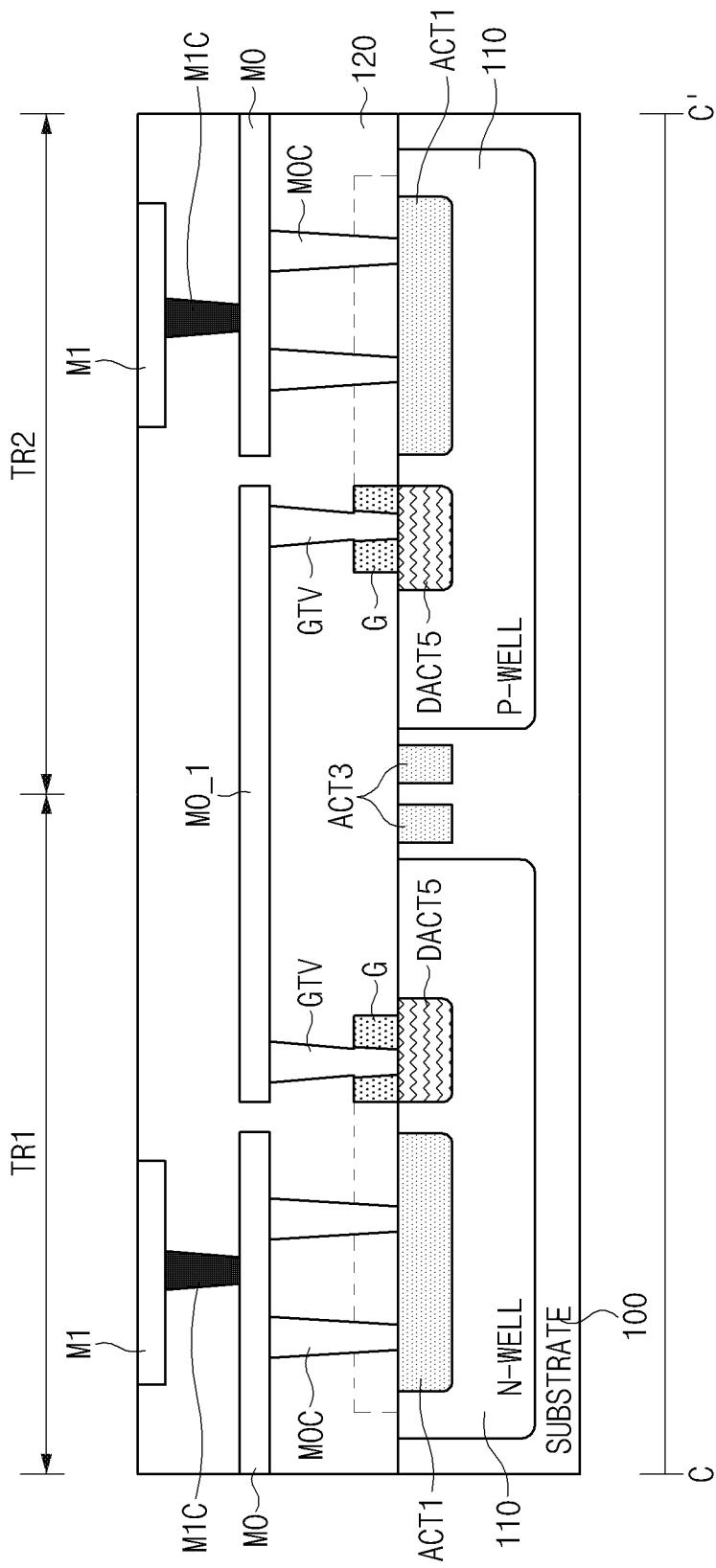
FIG. 6 is a cross-sectional view illustrating an example of a semiconductor device taken along the line C-C' shown in FIG. 5 in accordance with an embodiment of the disclosure.

FIG. 5 is a diagram illustrating an example of a layout structure of a semiconductor device in accordance with an embodiment of the disclosure. FIG. 6 is a cross-sectional view illustrating an example of a semiconductor device taken along the line C-C' shown in FIG. 5 in accordance with an embodiment of the disclosure. In FIGS. 5 and 6, constituent elements that are the same as those in FIGS. 1 and 2 are denoted by the same reference numbers, and as such a detailed description thereof will herein be omitted for convenience of description.

Referring to FIGS. 5 and 6, the transistor region TR1 and the transistor TR2 may be symmetrical to each other across a line therebetween in the first direction (I). That is, the transistor region TR1 and the transistor region TR2 may be arranged to face each other while simultaneously having a mirrored symmetrical structure with respect to the first direction (I).

In FIG. 6, the gate-through-silicon via (GTV) of the transistor region TR1 and the gate-through-silicon via (GTV) of the transistor region TR2 may be electrically coupled to each other through the metal layer (M0_1). That is, the gate (G) of the transistor region TR1, the gate (G) of the transistor region TR2, and the dummy active region DACT5 of each of the transistors may be electrically coupled to one another through the metal layer (M0_1).

As is apparent from the above description, the semiconductor device based on embodiments of the disclosed technology can improve stress of at least one transistor, and can reduce the overall size of a region to be occupied.

Embodiments of the disclosed technology may provide a variety of effects capable of being directly or indirectly recognized through the above-mentioned patent document.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a first active region disposed over a well region of a substrate;
   a plurality of dummy active regions disposed around the first active region; and
   a gate disposed to traverse the first active region,
   wherein a portion of the gate is disposed to overlap with at least one of the plurality of dummy active regions and is electrically coupled to the at least one of the plurality of dummy active regions, and
   wherein the first active region is disposed in a center region of the well region, and the plurality of dummy active regions are disposed in a vicinity of an outer wall of the first active region,
   wherein the plurality of dummy active regions are disposed to surround four sides of the first active region.

2. The semiconductor device according to claim 1, wherein the first active region has a rectangular shape.

3. The semiconductor device according to claim 1, further comprising:
   a second active region disposed at one side of the first active region with respect to a second direction; and a third active region disposed at the other side of the first active region with respect to the second direction.

4. The semiconductor device according to claim 3, wherein:
each of the second active region and the third active region has a line shape extending in a first direction, and the second active region and the third active region are spaced apart from each other by a predetermined distance in the second direction.

5. The semiconductor device according to claim 1, wherein the plurality of dummy active regions includes:
a first dummy active region disposed at one side of the first active region with respect to a first direction;
a second dummy active region disposed at the other side of the first active region with respect to the first direction;
a third dummy active region disposed at one side of the first active region with respect to a second direction; and
a fourth dummy active region, a fifth dummy active region, and a sixth dummy active region disposed at other side of the first active region with respect to the second direction, where the fourth, fifth and sixth dummy active regions are spaced apart from one another by a predetermined distance in the first direction.

6. The semiconductor device according to claim 5, wherein:
each of the first dummy active region and the second dummy active region has a line shape extending in the second direction, and is longer than the first active region in the second direction.

7. The semiconductor device according to claim 5, wherein the first dummy active region and the second dummy active region are spaced apart from each other by a predetermined distance in the first direction.

8. The semiconductor device according to claim 5, wherein:
the third dummy active region is disposed between the first dummy active region and the second dummy active region in the first direction.

9. The semiconductor device according to claim 5, wherein the third dummy active region has the same width as the first active region in the first direction.

10. The semiconductor device according to claim 5, wherein the fifth dummy active region is electrically coupled to the gate.

11. The semiconductor device according to claim 10, further comprising:
a gate-through-silicon via that passes through the gate and couples to the fifth dummy active region, and configured to enable the fifth dummy active region to be coupled to a first metal layer.

12. The semiconductor device according to claim 11, further comprising:
a plurality of metal layers, including the first metal layer, formed over the substrate,
wherein
the first metal layer is coupled to the gate and the fifth dummy active region through the gate-through-silicon via, and
a second metal layer from among the plurality of metal layers is coupled to the first active region through a contact.

13. The semiconductor device according to claim 12, wherein:

the first metal layer is disposed over the gate and the fifth dummy active region in a vertical direction; and
the second metal layer is disposed over the first active region in the vertical direction.

14. The semiconductor device according to claim 13, further comprising:
a third metal layer formed over the second metal layer in the vertical direction.

15. The semiconductor device according to claim 5, wherein the gate has a hammer shape that has a handle extending in the second direction and a head protruding in the first direction.

16. The semiconductor device according to claim 15, wherein the hammer head region of the gate protruding in the first direction is disposed over the fifth dummy active region in the vertical direction.

17. The semiconductor device according to claim 5, further comprising:
a dummy gate disposed around edges of the plurality of dummy active regions when viewed in the vertical direction,
wherein a portion of the dummy gate traverses the third dummy active region in the second direction.

18. A semiconductor device comprising:
a first active region formed over a well region of a substrate;
a plurality of dummy active regions formed over the well region, and spaced apart from the first active region by a predetermined distance;
a gate disposed over one dummy active region among the plurality of dummy active regions; and
a gate-through-silicon via coupled to the one dummy active region and passing through the gate, and configured to couple the one dummy active region to a first metal layer disposed over the gate.

19. The semiconductor device according to claim 18, further comprising:
a contact configured to couple the first active region to a second metal layer disposed over the first active region.

20. The semiconductor device according to claim 18, wherein the gate is formed over the same line as the dummy active region in a vertical direction, and is electrically coupled to the gate-through-silicon via.

21. A semiconductor device comprising:
a first transistor region; and
a second transistor region arranged to be symmetrical to the first transistor region with respect to a first direction;
wherein each of the first transistor region and the second transistor region includes
a first active region disposed over a well region of a substrate;
a dummy active region disposed over the well region, and spaced apart from the first active region by a predetermined distance;
a gate formed over the dummy active region,
a gate-through-silicon via coupled to the dummy active region and passing through the gate; and
a first metal layer that couples the dummy active region to the gate.

22. The semiconductor device according to claim 21, wherein the first transistor region and the second transistor region share the first metal layer, which electrically couples the gate-through-silicon via of the first transistor region to the gate-through-silicon via of the second transistor region.

* * * * *